United States Patent
Park et al.

(10) Patent No.: US 11,587,961 B2
(45) Date of Patent: Feb. 21, 2023

(54) IMAGE SENSOR FOR DETECTING A DISTANCE FROM A TARGET OBJECT

(71) Applicant: SK hynix Inc., Gyeonggi-do (KR)

(72) Inventors: Yu Jin Park, Gyeonggi-do (KR); Kang Bong Seo, Gyeonggi-do (KR); Nam Ryeol Kim, Gyeonggi-do (KR); Jung Soon Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 101 days.

(21) Appl. No.: 17/012,782

(22) Filed: Sep. 4, 2020

(65) Prior Publication Data
US 2021/0335868 A1 Oct. 28, 2021

(30) Foreign Application Priority Data
Apr. 27, 2020 (KR) .................. 10-2020-0050623

(51) Int. Cl.
*H01L 27/146* (2006.01)
*H04N 5/3745* (2011.01)

(52) U.S. Cl.
CPC ..... *H01L 27/14607* (2013.01); *H04N 5/3745* (2013.01)

(58) Field of Classification Search
None
See application file for complete search history.

(56) References Cited

U.S. PATENT DOCUMENTS

| | | | |
|---|---|---|---|
| 2009/0135283 A1 | 5/2009 | Lee | |
| 2017/0194367 A1* | 7/2017 | Fotopoulou | H01L 27/1461 |
| 2019/0025414 A1* | 1/2019 | Van Der Tempel | H04N 5/341 |
| 2019/0252449 A1 | 8/2019 | Ebiko | |
| 2019/0342510 A1* | 11/2019 | Sano | H01L 27/1461 |
| 2020/0003874 A1* | 1/2020 | Moriyama | H04N 5/36965 |
| 2020/0027909 A1* | 1/2020 | Ebiko | H01L 27/14634 |
| 2021/0255282 A1* | 8/2021 | Katayama | H01L 27/14603 |

OTHER PUBLICATIONS

Nieuwenhove et al., Time-of-flight Optical Ranging Sensor Based on a Current Assisted Photonic Demodulator, Proceedings Symposium IEEE/LEOS Benelux Chapter, 2006, Eindhoven, pp. 209-212.

Kato et al., 320×240 Back-Illuminated 10-µm CAPD Pixels for High-Speed Modulation Time-of-Flight CMOS Image Sensor, IEEE Journal of Solid-State Circuits, vol. 53, No. 4, Apr. 2018, pp. 1071-1078.

Tempel et al., An active demodulating pixel using a Current Assisted Photonic Demodulator implemented in 0.6 µm Standard CMOS, 3rd IEEE International Conference on Group IV Photonics, 2006, pp. 116-118.

* cited by examiner

*Primary Examiner* — Twyler L Haskins
*Assistant Examiner* — Dwight Alex C Tejano
(74) *Attorney, Agent, or Firm* — IP & T Group LLP

(57) ABSTRACT

An image sensor is disclosed, which relates to technology for detecting the distance to a target object. The image sensor includes a first tap configured to capture and accumulate signal carriers, and a second tap spaced apart a set distance from the first tap. The first tap and the second tap are disposed in a diagonal direction at opposite vertex regions of a unit pixel.

20 Claims, 5 Drawing Sheets

IMAGE SENSOR FOR DETECTING A DISTANCE FROM A TARGET OBJECT

CROSS-REFERENCE TO RELATED APPLICATION

This patent document claims priority to Korean patent application No. 10-2020-0050623, filed on Apr. 27, 2020, the disclosure of which is incorporated in its entirety by reference herein.

TECHNICAL FIELD

The technology and implementations disclosed in this patent document generally relate to an image sensor, and more particularly to technology for detecting the distance to a target object.

BACKGROUND

An image sensor captures image(s) using semiconductor characteristics that react to light. In recent times, with the increasing development of computer and communication technologies, demand for high-quality and high-performance image sensors is rapidly increasing in various devices and applications, for example, smartphones, digital cameras, game consoles, Internet of Things (IoT), robots, surveillance cameras, medical micro-cameras, etc.

Image sensors may be broadly classified into two types: a CCD (Charge Coupled Device)-based image sensor and a CMOS(Complementary Metal Oxide Semiconductor)-based image sensor. The CCD image sensor may be superior to the CMOS image sensor in terms of noise and image quality. However, the CMOS image sensor may be driven more easily than the CCD image sensor, and may be implemented using many more scanning schemes than the CCD image sensor. In addition, the CMOS image sensor allows a signal processing circuit to be integrated into a single chip, such that the CMOS image sensor can be easily fabricated as a small-sized product, has very lower power consumption, and is compatible with CMOS fabrication technology, resulting in reduction in production costs. In recent times, the CMOS image sensor has been designed to be more compatible with mobile devices, such that CMOS image sensing devices have been intensively researched and have rapidly come into widespread use.

SUMMARY

Various embodiments of the disclosed technology relate to an image sensor capable of minimizing power consumption of a Current-Assisted Photonic Demodulator (CAPD) by maximizing the distance between taps contained in each pixel.

In accordance with an embodiment of the disclosed technology, an image sensor may include a first tap configured to capture and accumulate signal carriers, and a second tap spaced apart a set distance from the first tap. The first tap and the second tap may be disposed in a diagonal direction at opposite vertex regions of a unit pixel.

In accordance with another embodiment of the disclosed technology, an image sensor may include a pixel array configured to include a plurality of unit pixels arranged in a matrix shape and contiguous to each other, and a plurality of taps disposed at vertex regions of the plurality of pixels, two of the plurality of taps being associated with each unit pixel. For each pixel, the associated two taps arranged diagonally within that unit pixel.

In accordance with another embodiment of the disclosed technology, an image sensor including an array of unit pixels, wherein each unit pixel includes: a first tap configured to capture and accumulate signal carriers within a hole current through a rectilinear-shaped detection node; and a second tap configured to provide the hole current through a controller, wherein the first and second taps are separated from each other by a longest distance within the unit pixel, wherein the controller is formed in a substantially round shape within the unit pixel, and wherein the rectilinear-shaped detection node extends in a direction substantially perpendicular to a diagonal extending between the first and second taps.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
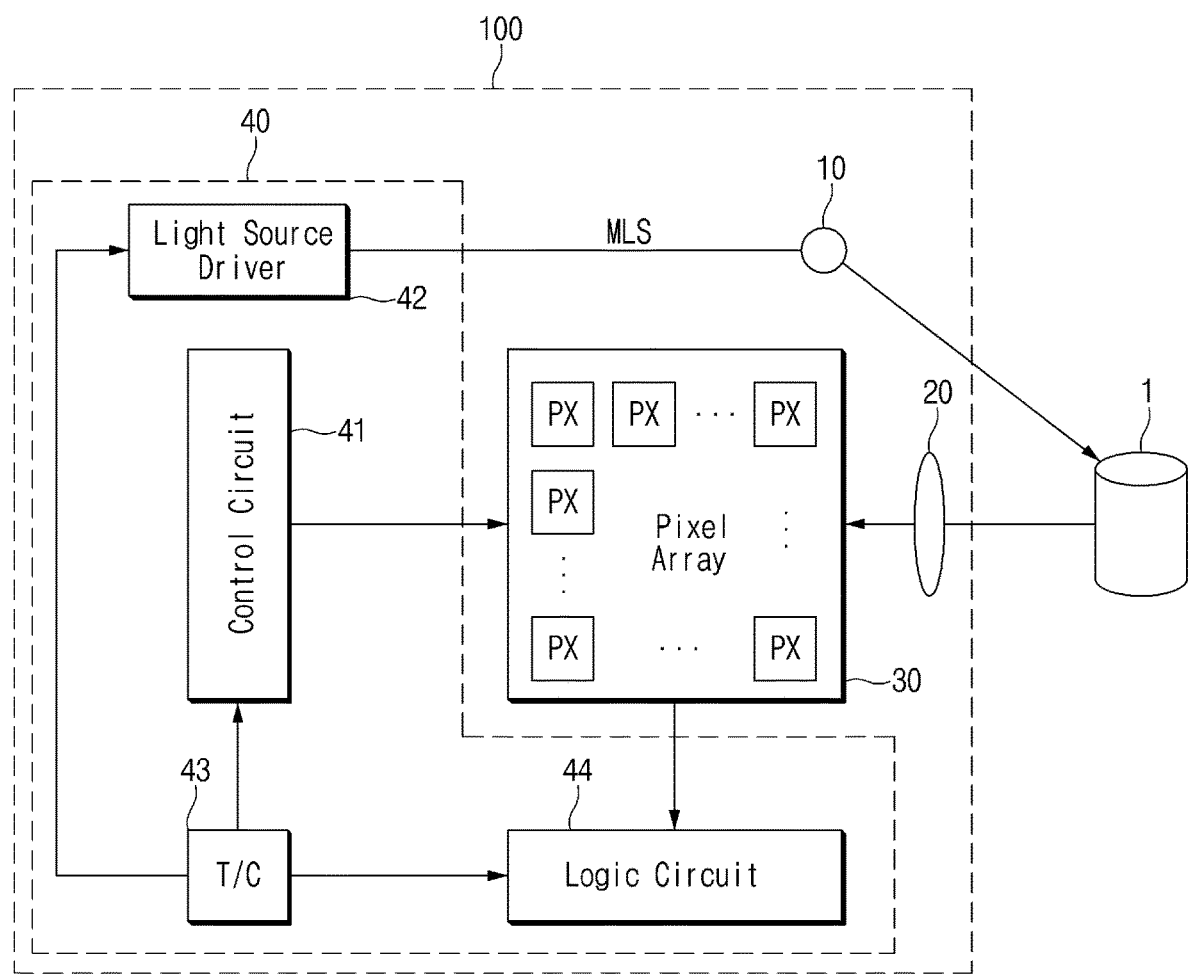
FIG. 1 is a block diagram illustrating an example of an image sensor based on some implementations of the disclosed technology.

This patent document provides implementations and examples of an image sensor device that substantially addresses one or more issues due to limitations and disadvantages of the related art. Some implementations of the disclosed technology are directed to an image sensor device which can minimize power consumption of a Current-Assisted Photonic Demodulator (CAPD) by maximizing the distance between taps contained in pixels. In recognition of the issues above, the disclosed technology provides various implementations of an image sensor device which can minimize power consumption of a Current-Assisted Photonic Demodulator (CAPD).

Reference will now be made in detail to embodiments of the disclosed technology, examples of which are illustrated in the accompanying drawings. Wherever possible, the same reference numbers are used throughout the drawings to refer to the same or like portions. Throughout the specification, reference to "an embodiment," "another embodiment" or the like is not necessarily to only one embodiment, and different references to any such phrase are not necessarily to the same embodiment(s).

Advantages and features of the present invention and methods of achieving the same will be clearly understood from embodiments described hereinafter in conjunction with the accompanying drawings. However, the present invention is not limited to the following embodiments, as features and aspects of the invention may be realized in various different forms. These embodiments are provided to enable those skilled in the art to understand and practice the present invention. That is, the present invention is defined only by the claims. In the drawings, the sizes or relative sizes of layers and regions may be exaggerated for clarity.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated elements, steps, operations, and/or components, but do not preclude the presence or addition of one or more other elements, steps, operations, and/or components. The term "and/or" may include any one or any combination of the identified items.

In the following description, the terms "first", "second" and the like may be used to identify various elements, components, and/or sections, but the elements, components, and/or sections are not limited by these terms. These terms may be used to distinguish one component, constituent element, or section from another component, constituent element, or section that otherwise have the same or similar name. For example, a first element in one instance may be referred to a second element in another instance without indicating any change in the element itself.

When an element or a layer is referred to as being "on" another element or another layer, it can be directly on the element or the layer, or one or more intervening elements or layers may also be present. In contrast, when an element or a layer is referred to as being "directly on" another element or another layer, it means that no intervening elements or layers are present.

Spatially relative terms such as "below," "beneath," "lower," "above," or "upper" may be used herein to describe one element's relationship to another element as illustrated in the drawings. It will be understood that spatially relative terms are intended to encompass different orientations of the elements during the use or operation of the elements in addition to the orientation depicted in the drawings.

Furthermore, the embodiments described herein may be understood with reference to various views, which are represented in ideal exemplary diagrams of the disclosed technology. Accordingly, forms of the exemplary diagrams may be changed by fabrication technology and/or tolerance. Accordingly, the embodiments of the disclosed technology are not limited to the illustrated specific forms but may include changes in forms resulting from a fabrication process. Accordingly, regions illustrated in the drawings have schematic attributes, and the shapes of the illustrated regions are intended to illustrate a specific form of a region of the element (or device) but are not intended to limit the scope of the present invention.

Various schemes for measuring depth (i.e., a distance to a target object) using image sensors have been intensively developed by many developers and companies. For example, demand for the above-mentioned depth measurement schemes using image sensors is rapidly increasing in various fields, for example, security devices, medical devices, automobiles, game consoles, virtual reality (VR)/augmented reality (AR) devices, mobile devices, etc. There are various methods for measuring depth information using one or more image sensors including a triangulation method, a Time of Flight (TOF) method, and an interferometry method. Among these methods, the Time of Flight (TOF) method is applicable in many more technical fields, can be processed and operate at a higher speed, and has superior cost efficiency. Thus, the TOF method has a higher degree of importance.

The TOF method itself includes a direct method and an indirect method. The direct method may use the common principles in which the distance (i.e., depth) to a target object is calculated using emitted light and reflected light, thereby measuring the distance (i.e., depth) to the target object using the calculated round trip time. The indirect method may measure the distance to the target object using a phase difference.

The direct method has advantages in terms of long-distance measurement, such that the direct method has been widely used in automobiles and the like. The indirect method has advantages in terms of short-distance measurement, such that the indirect method has been widely used in various higher-speed devices designed to operate at a higher speed, for example, game consoles, mobile cameras, or the like. The indirect method is simpler in circuit design and is designed to have a smaller number of memories, such that the indirect method can be implemented using at relatively lower cost.

A Current-Assisted Photonic Demodulator (CAPD) method applied to one of pixel types corresponding to indirect TOF sensors is a method for detecting electrons that have been generated in pixels using a majority current (of majority carriers) acquired by applying a voltage to a substrate, using a difference in potential between electric fields. In this way, since the CAPD method is designed to use the majority current, the CAPD method can more quickly detect electrons and can detect some electrons formed at a deep depth, such that the CAPD method has superior efficiency.

FIG. 1 is a block diagram illustrating an example of an image sensor based on some implementations of the disclosed technology.

Referring to FIG. 1, the image sensor 100 may measure the distance to a target object 1 using the Time of Flight (TOF) principle. The image sensor 100 may include a light source 10, a lens module 20, a pixel array 30, and a control block 40.

The light source 10 may emit light to a target object 1 upon receiving a clock signal MLS from the control circuit 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source in which a white lamp is combined with a monochromator, and a combination of other laser sources. For example, the light source 100 may emit infrared light having a wavelength of 800 nm to 1000 nm. Light emitted from the light source 10 may be modulated by a set frequency. Although FIG. 1 shows only one light source 10 for clarity, the present invention is not limited thereto. In another embodiment, a plurality of light sources may be arranged in the vicinity of the lens module 20.

The lens module 20 may collect light reflected from the target object 1 and may allow the collected light to be focused onto pixels (PXs) of the pixel array 30. For example, the lens module 20 may include a focusing lens having a surface formed of glass or plastic or another cylindrical optical element having a surface formed of glass or plastic.

The lens module 20 may include a plurality of lenses centered upon an optical axis.

The pixel array 30 may include unit pixels (PXs) consecutively arranged in a two-dimensional (2D) structure in which unit pixels are arranged not only in a column direction, but also in a row direction perpendicular to the column direction. The unit pixels (PXs) may be formed over a semiconductor substrate. Each unit pixel (PX) may convert incident light received through the lens module 20 into an electrical signal corresponding to the amount of incident light and may thus output a pixel signal using the electrical signal. In this case, the pixel signal may indicate the distance to the target object 1, although not necessarily the color thereof. Each unit pixel (PX) may be a Current-Assisted Photonic Demodulator (CAPD) pixel. The structure and operations of each unit pixel (PX) are described below with reference to FIG. 2.

The control block 40 may emit light to the target object 1 by controlling the light source 10. The control block 40 may process each pixel signal corresponding to light reflected from the target object 1 by driving unit pixels (PXs) of the pixel array 30, and may measure the distance to the surface of the target object 1 using the processed result.

The control block 40 may include a control circuit 41, a light source driver 42, a timing controller 43, and a logic circuit 44.

The control circuit 41 may drive unit pixels (PXs) of the pixel array in response to a timing signal generated from the timing controller 43. For example, the control circuit 41 may generate a control signal capable of selecting and controlling at least one row line from among the plurality of row lines. The control signal may include a demodulation control signal for generating a hole current in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor, and the like. Although FIG. 1 illustrates, by way of example, the control circuit 41 arranged in a column direction (i.e., a vertical direction) of the pixel array 30, at least some parts (e.g., a circuit for generating a demodulation control signal) of the control circuit 41 may be arranged in a row direction (i.e., a horizontal direction) of the pixel array 30.

The light source driver 42 may generate a clock signal MLS capable of driving the light source 10 in response to a control signal from the timing controller 43. The clock signal MLS may be modulated by a set frequency.

The timing controller 43 may generate a timing signal to control the control circuit 41, the light source driver 42, and the logic circuit 44.

The logic circuit 44 may process pixel signals received from the pixel array 30 under control of the timing controller 43 and may thus generate pixel data as a digital signal. To this end, the logic circuit 44 may include a correlated double sampler (CDS) circuit for performing correlated double sampling (CDS) on the pixel signals generated from the pixel array 30. In addition, the logic circuit 44 may include an analog-to-digital converter (ADC) for converting output signals of the CDS circuit into digital signals. In addition, the logic circuit 44 may include a buffer circuit that temporarily stores pixel data generated from the analog-to-digital converter (ADC) and outputs the pixel data under control of the timing controller 43. Since the pixel array 30 includes CAPD pixels, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a set frequency to a scene captured by the image sensor 100. The image sensor 100 may sense modulated light (i.e., incident light) reflected from the target object(s) 1 in the scene and may thus generate depth information for each unit pixel (PX). A time delay based on the distance between the image sensor 100 and each target object 1 may occur between the modulated light and the incident light. The time delay may be denoted by a phase difference between the signal generated by the image sensor 100 and the clock signal MLS controlling the light source 10. An image processor (not shown) may calculate a phase difference generated in the output signal of the image sensor 100 and may thus generate a depth image including depth information for each unit pixel (PX).

Figure 2:
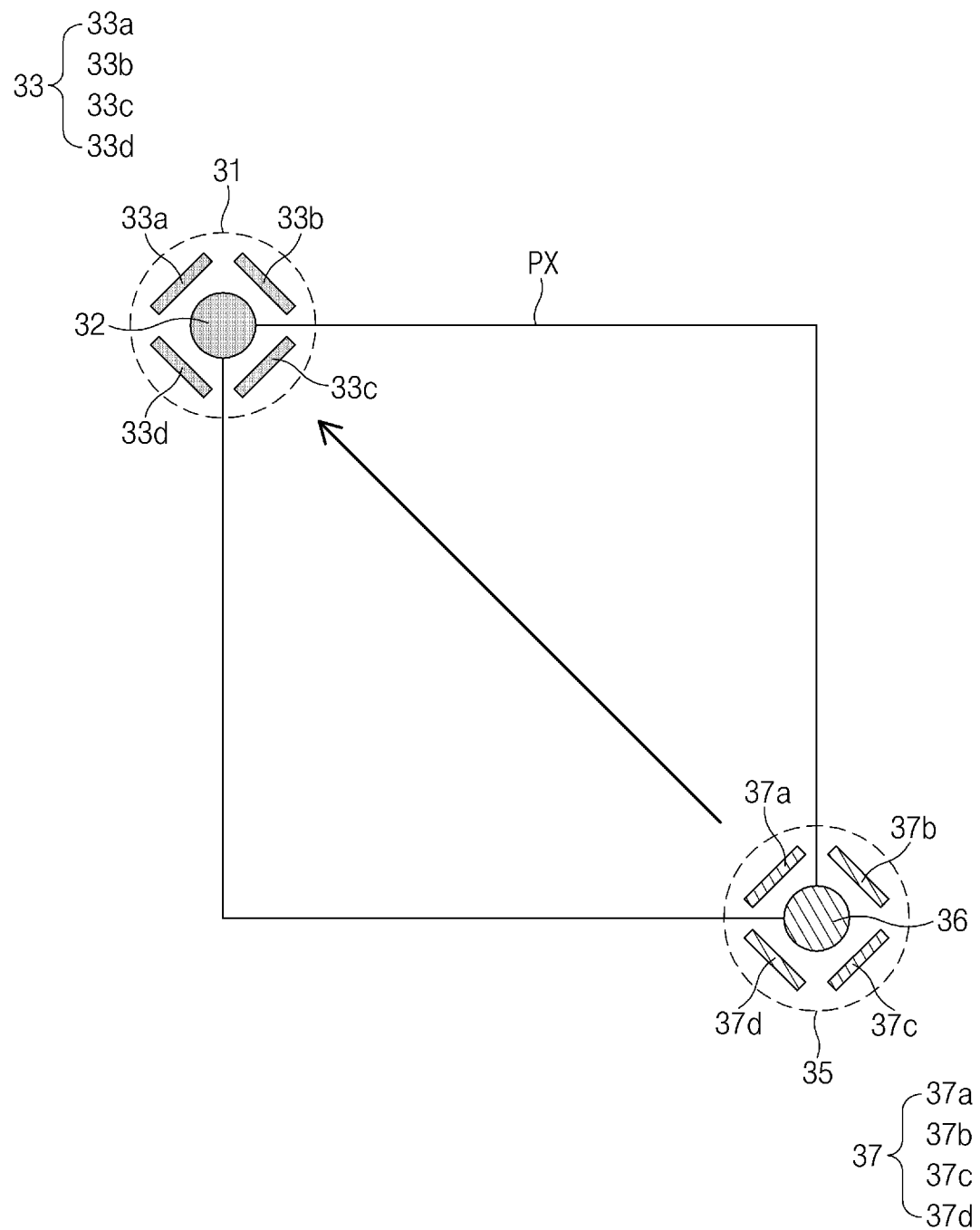
FIG. 2 is a layout diagram illustrating an example of a unit pixel, such as that shown in FIG. 1, based on some implementations of the disclosed technology.

FIG. 2 is a layout diagram illustrating an example of the unit pixel (PX) shown in FIG. 1 based on some implementations of the disclosed technology.

Referring to FIG. 2, the unit pixel (PX) may include one pair of taps 31 and 35 that are spaced apart from each other by a set distance. Each of the two taps 31 and 35 of the pair may receive a control signal from the control circuit 41. When a voltage corresponding to the control signal is applied to one tap 35 of the two paired taps 31 and 35, a current may occur between the two taps 31 and 35, and signal carriers generated by photoelectric conversion may be induced and collected in the other tap 31. The taps 31 and 35 corresponding to one pair may capture signal carriers in response to control signals A and B (see FIGS. 4 and 5) and may accumulate the captured signal carriers.

In this case, the paired taps 31 and 35 may be arranged in a diagonal direction within the unit pixel (PX) and may be disposed at opposite vertex regions of the unit pixel (PX). That is, the tap 31 may be disposed at an upper-left vertex region within the unit pixel (PX), and the tap 35 may be disposed at a lower-right vertex region within the unit pixel (PX). In other words, the tap 31 and the tap 35 may be arranged along a diagonal line (or in a diagonal direction) that forms a set angle with respect to one side (e.g., left side or upper side) of the unit pixel (PX) within the unit pixel (PX).

Although FIG. 2 illustrates, by way of example, that the tap 31 is disposed at an upper left end of the unit pixel (PX) and the tap 35 is disposed at a lower right end of the unit pixel (PX), the present invention is not limited thereto. To that end, it should be noted that the tap 31 can be disposed at a lower left end of the unit pixel (PX) and the tap 35 can be disposed at an upper right end of the unit pixel (PX) as necessary.

The tap 31 may include a controller 32 and a detector 33. The tap 35 may include a controller 36 and a detector 37. Each of the controllers 32 and 36 may generate a hole current including signal carriers. Each of the detector 33 and 37 may detect signal carriers corresponding to incident light.

In the tap 31, the controller 32 may be arranged to overlap with the upper-left vertex region of the unit pixel (PX) and may be formed in a circular shape, which in three dimensions may be spherical. In the tap 31, the detector 33 may be arranged to surround the controller 32. The detector 33 may include a plurality of detection nodes 33a~33d spaced apart from each other by a set distance while omnidirectionally surrounding a peripheral region of the controller 32. The detection nodes 33a~33d may be physically isolated from one another. The detection nodes 33a~33d may be arranged to surround the controller 32 in a rectangular shape without vertices, as shown in FIG. 2. That is, the detection nodes 33a~33d may be arranged in a manner that the detection nodes 33a~33d are not disposed to completely surround the controller 32; at least some parts, e.g., corners, thereof are open.

Each of the detection nodes 33a~33d may be an elongated structure. A length of each detection node 33a~33d may be the same of the width (i.e., diameter or circumference) of the controller 32. One pair of detection nodes 33a and 33c of the plurality of detection nodes 33a~33d may have the same length. The other pair of detection nodes 33b and 33d may have the same length. The detection nodes 33a~33d and the detection nodes 37a~37d may be obliquely arranged with respect to a side of unit pixel (PX). Such an oblique arrangement may indicate that the length direction of each of the detection nodes 33a~33d is not parallel or perpendicular to any one side (i.e., upper side, lower side, left side, or right side) of the unit pixel (PX). Instead, each detection node is positioned such that its length direction oblique relative to a side of the unit pixel (PX) as shown in FIG. 2.

In the tap 35, the controller 36 may be arranged to overlap with the lower-right vertex region of the unit pixel (PX) and may be formed in a circular shape, which in three dimensions may be spherical. In the tap 35, the detector 37 may be arranged to surround the controller 36. The detector 37 may include the plurality of detection nodes 37a~37d spaced apart from each other by a set distance while omnidirectionally surrounding a peripheral region of the controller 36. The detection nodes 37a~37d may be physically isolated from one another. The detection nodes 37a~37d may be arranged to surround the controller 36 in a rectangular shape without vertices, as shown in FIG. 2. That is, the detection nodes 37a~37d may be arranged in a manner that the detection nodes 37a~37d are not disposed to completely surround the controller 36; at least some parts, e.g., corners, thereof are open.

Each of the detection nodes 37a~37d may be an elongated structure. A length of each detection node 37a~37d may be the same as the width of the controller 36. One pair of detection nodes 37a and 37c of the plurality of detection nodes 37a~37d may have the same length. The other pair of detection nodes 37b and 37d may have the same length. The detection nodes 37a~37d may be obliquely arranged in a manner that two detection nodes of a given pair face each other. Such an oblique arrangement may indicate that the length direction of each of the detection nodes 37a~37d is not parallel or perpendicular to any one side (i.e., upper side, lower side, left side, or right side) of the unit pixel (PX). Instead, each detection node is positioned such that its length direction is at a set angle with respect to a side of the unit pixel (PX) as shown in FIG. 2.

An amount of hole current flowing between the taps 31 and 35 receiving different voltages may be proportional to the potential difference between the taps 31 and 35, may be inversely proportional to the distance between the taps 31 and 35, and may be proportional to the length of the facing surfaces of the taps 31 and 35. In other words, the amount of the hole current may depend on a potential difference between the taps 31 and 35 and a resistance between the taps 31 and 35. The longer the distance between the taps 31 and 35, the higher the resistance between the taps 31 and 35. In addition, the shorter the length of facing surfaces of the taps 31 and 35, the higher the resistance between the taps 31 and 35. In the following description, it is assumed that the potential difference between two taps of a given pair is the same for respective tap pairs.

In the layout structure shown in FIG. 2 in which the taps 31 and 35 are respectively disposed in the diagonal vertex regions, the distance between the taps 31 and 35 may increase, resulting in increased resistance. As a result, a hole current flowing between the taps 31 and 35 may be reduced so that power consumption needed to drive the pixel array 30 may be reduced.

Figure 3:
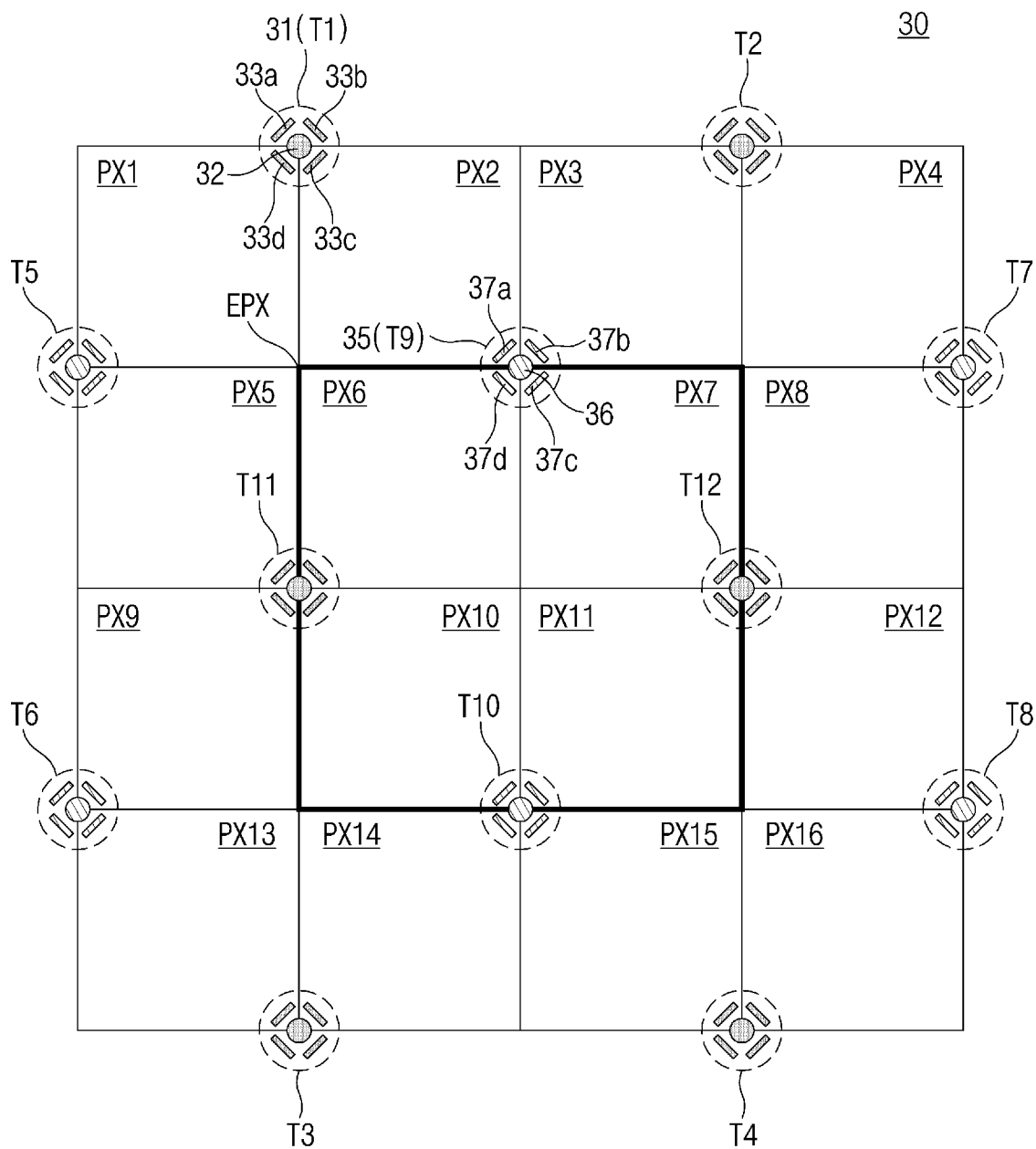
FIG. 3 is a layout diagram illustrating an example of a pixel array, such as that shown in FIG. 1, based on some implementations of the disclosed technology.

FIG. 3 is a layout diagram illustrating an example of the pixel array 30 shown in FIG. 1 based on some implementations of the disclosed technology. The detailed structure and function of each unit pixel (PX) contained in the pixel array 30 is the same as that described in connection with FIG. 2.

Referring to FIG. 3, the pixel array 30 may include a plurality of unit pixels PX1~PX16. The unit pixels PX1~PX16 may be arranged such that any four adjacent pixels forms a (4×4) matrix shape. One such 4×4 matrix of pixels is shown in bold outline in FIG. 3. In the following description, although the pixel array 30 includes 16 unit pixels PX1~PX16, such representation is merely an example; the present invention is not limited thereto. Any suitable number of unit pixels may be used depending on application and design considerations. The unit pixel PX2, among the plurality of unit pixels PX1~PX16 shown in FIG. 3, may correspond to the unit pixel (PX) shown in FIG. 2.

In the unit pixels PX1~PX16 contained in the pixel array 30, a plurality of taps T1~T12 may be arranged in a diagonal direction with respect to the unit pixels. The plurality of taps T1~T12 may be disposed at vertex regions of the unit pixels PX1~PX16. In the pixel array 30, the taps associated with two horizontally or vertically adjacent unit pixels (i.e., one pair of unit pixels) are arranged to form a triangular shape, as shown in FIG. 3. In the pixel array 30, two unit pixels (i.e., one pair of unit pixels) that are arranged contiguous to each other in a vertical or horizontal direction from among the unit pixels PX1~PX16 may be arranged in a manner that the taps T1~T12 are arranged symmetrical to each other with respect to a boundary between the unit pixels.

In the pixel array 30, the taps T1 and T2 may be arranged along the top edge of the pixel array 30, which is formed by contiguous upper side surfaces of the unit pixels PX1~PX4. The tap T1 may be shared by two paired unit pixels PX1 and PX2. In this case, the tap T1 may be shared by a total of four pixels. Here, the four pixels may include the unit pixel PX1, the unit pixel PX2, a pixel (not shown) disposed above the unit pixel PX1, and a pixel (not shown) disposed above the unit pixel PX2. The tap T2 may be shared by two paired unit pixels PX3 and PX4. In this case, the tap T2 may be shared by a total of four pixels. Here, the four pixels may include the unit pixel PX3, the unit pixel PX4, a pixel (not shown) disposed above the unit pixel PX3, and a pixel (not shown) disposed above the unit pixel PX4.

In the pixel array 30, the taps T3 and T4 may be arranged along the lower edge of the pixel array 30, which is formed by contiguous lower side surfaces of the unit pixels PX13~PX16. The tap T3 may be shared by two paired unit pixels PX13 and PX14. In this case, the tap T3 may be shared by a total of four pixels. Here, the four pixels may include the unit pixel PX13, the unit pixel PX14, a pixel (not shown) disposed at a lower portion of the unit pixel PX13, and a pixel (not shown) disposed at a lower portion of the unit pixel PX14. The tap T4 may be shared by two paired unit pixels PX15 and PX16. In this case, the tap T4 may be shared by a total of four pixels. Here, the four pixels may include the unit pixel PX15, the unit pixel PX16, a pixel (not shown) disposed below the unit pixel PX15, and a pixel (not shown) disposed below the unit pixel PX16.

In the pixel array 30, the taps T5 and T6 may be arranged along the left edge of the pixel array 30, which is formed by contiguous left side surfaces of the unit pixels PX1, PX5, PX9, and PX13. The tap T5 may be shared by two paired unit pixels PX1 and PX5. In this case, the tap T5 may be shared by a total of four pixels. Here, the four pixels may include the unit pixel PX1, the unit pixel PX5, a pixel (not shown) disposed at the left side of the unit pixel PX1, and a pixel (not shown) disposed at the left side of the unit pixel PX5. The tap T6 may be shared by two paired unit pixels PX9 and PX13. In this case, the tap T6 may be shared by a total of four pixels. Here, the four pixels may include the unit pixel PX9, the unit pixel PX13, a pixel (not shown) disposed at the left side of the unit pixel PX9, and a pixel (not shown) disposed at the left side of the unit pixel PX13.

In the pixel array 30, the taps T7 and T8 may be arranged along the right edge of the pixel array 30, which is formed by contiguous right side surfaces of the unit pixels PX4, PX8, PX12, and PX16. The tap T7 may be shared by two paired unit pixels PX4 and PX8. In this case, the tap T7 may be shared by a total of four pixels. Here, the four pixels may include the unit pixel PX4, the unit pixel PX8, a pixel (not shown) disposed at the right side of the unit pixel PX4, and a pixel (not shown) disposed at the right side of the unit pixel PX8. The tap T8 may be shared by two paired unit pixels PX12 and PX16. In this case, the tap T8 may be shared by a total of four pixels. Here, the four pixels may include the unit pixel PX12, the unit pixel PX16, a pixel (not shown) disposed at the right side of the unit pixel PX12, and a pixel (not shown) disposed at the right side of the unit pixel PX16.

In the pixel array 30, four unit pixels PX6, PX7, PX10, and PX11 arranged at the center part of the pixel array 30 may be included in an effective (or valid) pixel region (EPX). The taps T9~T12 may be arranged at upper, lower, left, and right side surfaces, respectively, of the effective pixel region (EPX).

The tap T9 may be shared by four unit pixels PX2, PX3, PX6, and PX7. The tap T10 may be shared by four unit pixels PX10, PX11, PX14, and PX15. The tap T11 may be shared by four unit pixels PX5, PX6, PX9, and PX10. The tap T12 may be shared by four unit pixels PX7, PX8, PX11, and PX12.

For example, in the tap T1, the controller 32 may be shared by two unit pixels PX1 and PX2. However, in the single tap T1, the detection nodes 33a~33b may be isolated from each other, such that one detection node from among the detection nodes 33a~33b may be disposed in the unit pixel PX1 and the another detection node may be disposed in the unit pixel PX2. In some implementations, the controller 32 of the tap T1 may be shared by a total of four pixels including the unit pixel PX1, the unit pixel PX2, a pixel (not shown) disposed above the unit pixel PX1, and a pixel (not shown) disposed above the unit pixel PX2.

In the tap T9, the controller 36 may be shared by four unit pixels PX2, PX3, PX6, and PX7. However, in the single tap T9, the detection nodes 37a, 37b, 37c, and 37d may be respectively disposed in four unit pixels PX2, PX3, PX6, and PX7 in a distributed manner. Therefore, in the single tap T9, signal carriers corresponding to the unit pixel PX2, signal carriers corresponding to the unit pixel PX3, signal carriers corresponding to the unit pixel PX6, and signal carriers corresponding to the unit pixel PX7 can be detected separately from one another.

That is, in the tap T9, the detection node 37a may detect signal carriers corresponding to the unit pixel PX2, the detection node 37b may detect signal carriers corresponding to the unit pixel PX3, the detection node 37c may detect signal carriers corresponding to the unit pixel PX7, and the detection node 37d may detect signal carriers corresponding to the unit pixel PX6.

Figure 4:
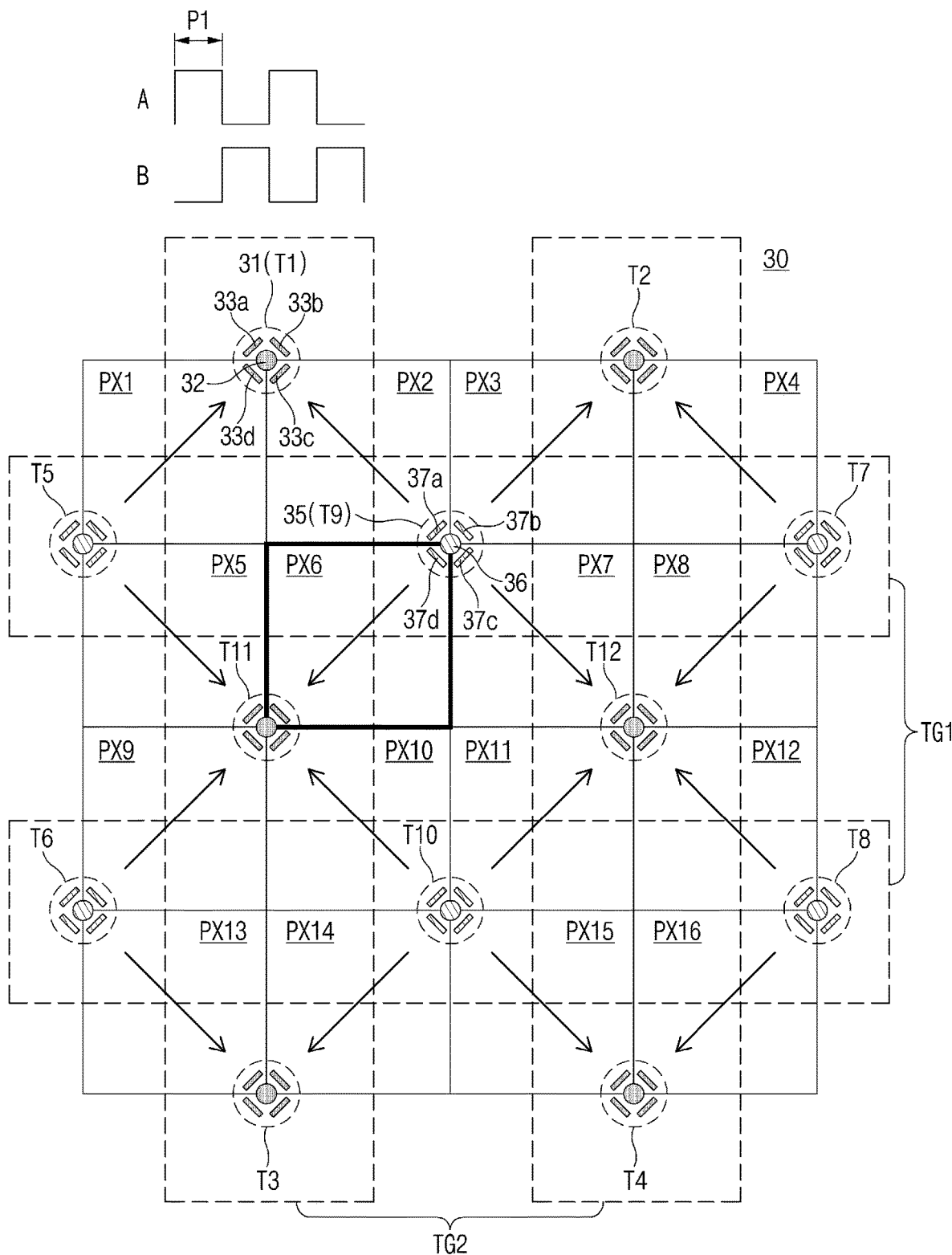
FIGS. 4 and 5 are conceptual diagrams illustrating operations of the pixel array, such as that shown in FIG. 3, based on some implementations of the disclosed technology.
Figure 5:
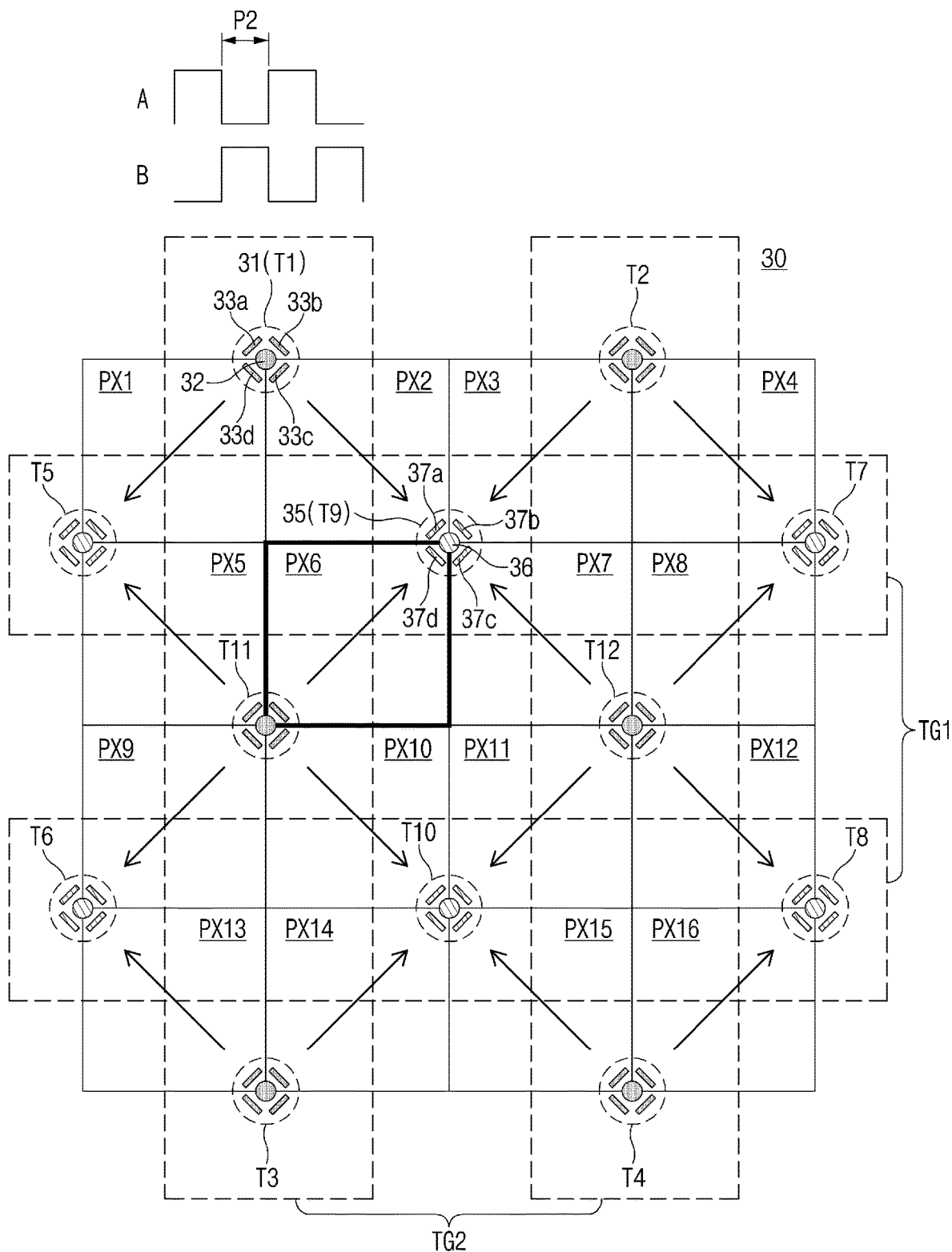

FIGS. 4 and 5 are conceptual diagrams illustrating operations of the pixel array 30 shown in FIG. 3 based on some implementations of the disclosed technology.

Referring to FIGS. 4 and 5, the pixel array 30 may be divided into a tap group TG1 and a tap group TG2 in response to control signals A and B. In this case, the tap group TG1 may include taps T5-T10 arranged in two rows and three columns, as shown in FIG. 4. That is, the tap group TG1 may be designed in a manner that the same control signal (A) is applied to the taps T5-T10. The tap group TG2 may include taps T1-T4, T11, and T12 arranged in three rows and two columns, as shown in FIG. 4. That is, the tap group TG2 may be designed in a manner that the same control signal (B) is applied to the taps T1-T4, T11, and T12. The operation for capturing photocharges of the pixel array 30 may be carried out throughout sequential time periods, i.e., a time period P1 and a time period P2.

FIG. 4 illustrates an example in which a hole current flows from the tap group TG1 to the tap group TG2. For example, during the time period P1, the control signal (A) of a logic high level may be applied to the tap T9, and the control signal (B) of a logic low level may be applied to the tap T11. In this case, the control signals A and B may be received from the control circuit 41. Potential difference between the control signals A and B may generate an electric field (or a hole current) by which flow of signal carriers generated in a substrate (not shown) by incident light is controlled. In other words, an electric field may be formed in the direction from the tap T9 to the tap T11 due to a voltage difference between the control signal (A) and the control signal (B), such that photocharges can be detected in the tap T9.

In other words, in the tap T9 included in the effective pixel region (EPX), a hole current can be transferred to the taps T1, T2, T11, and T12 respectively disposed in four contiguous unit pixels PX2, PX3, PX6, and PX7. In the tap T11 included in the effective pixel region (EPX), a hole current can be received from the taps T5, T6, T9, and T10 respectively disposed in four contiguous unit pixels PX5, PX6, PX9, and PX10.

FIG. 5 illustrates an example in which a hole current flows from the tap group TG2 to the tap group TG1. For example, during the time period P2 after lapse of the time period P1, the control signal (A) of a logic low level may be applied to the tap T9, and the control signal (B) of a logic high level may be applied to the tap T11. As a result, an electric field may be formed in the direction from the tap T11 to the tap T9 due to a voltage difference between the control signal (A) and the control signal (B), such that photocharges can be detected in the tap T11.

In other words, in the tap T11 included in the effective pixel region (EPX), a hole current can be transferred to the taps T5, T6, T9, and T10 respectively disposed in four contiguous unit pixels PX5, PX6, PX9, and PX10. In the tap T9 included in the effective pixel region (EPX), a hole current can be received from the taps T1, T2, T11, and T12 respectively disposed in four contiguous unit pixels PX2, PX3, PX6, and PX7.

As is apparent from the above description, the image sensor 100 based on some implementations of the disclosed technology can minimize power consumption of a Current-Assisted Photonic Demodulator (CAPD).

Those skilled in the art will appreciate that the embodiments may be carried out in specific ways other than those set forth herein without departing from the spirit and essential characteristics of the invention. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this invention. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor comprising:
a first tap configured to capture and accumulate signal carriers; and
a second tap spaced apart a set distance from the first tap,
wherein the first tap and the second tap are disposed in a diagonal direction at two opposite vertex regions of a unit pixel, respectively,
wherein each of the first tap and the second tap includes:
a controller configured to generate a hole current for moving the signal carriers in response to control signals having different phases; and
a detector configured to detect the signal carriers, and include a plurality of detection nodes that are disposed to surround the controller and are physically isolated from each other.

2. The image sensor according to claim 1, wherein the first tap and the second tap are configured to receive different control signals having a set potential difference therebetween.

3. The image sensor according to claim 1, wherein:
the first tap is disposed at an upper-left vertex region of the unit pixel; and
the second tap is disposed at a lower-right vertex region of the unit pixel.

4. The image sensor according to claim 1, wherein: the first tap and the second tap are arranged along a diagonal line that forms a set angle with respect to one side of the unit pixel.

5. The image sensor according to claim 1, wherein the controller is disposed at a single vertex region of the unit pixel and is formed in a circular shape.

6. The image sensor according to claim 1, wherein: the plurality of detection nodes are spaced apart from each other by a set distance while omnidirectionally surrounding a peripheral region of the controller.

7. The image sensor according to claim 1, wherein: the plurality of detection nodes surrounds the controller in a rectangular shape without contacting each other.

8. The image sensor according to claim 1, wherein: each of the plurality of detection nodes is an elongated structure.

9. The image sensor according to claim 8, wherein:
a length of each of the plurality of detection nodes is the same as width of the controller.

10. The image sensor according to claim 1, wherein each of the plurality of detection nodes has the same length.

11. The image sensor according to claim 1,
wherein the plurality of detection nodes comprise two pairs of detection nodes, the detection nodes in each pair being arranged to face each other,
wherein each detector node is disposed obliquely with respect to any side of the unit pixel.

12. The image sensor according to claim 11, wherein: a length direction of each of the plurality of detection nodes is obliquely disposed at a set angle with respect to one side of the unit pixel.

13. The image sensor according to claim 1, wherein the first tap and the second tap are separated from each other by a longest distance within a unit pixel and are arranged to overlap with two opposite vertex regions of the unit pixel, respectively.

14. An image sensor comprising:
a pixel array configured to include a plurality of unit pixels arranged in a matrix shape and contiguous to each other; and
a plurality of taps disposed at vertex regions of the plurality of unit pixels respectively, each unit pixel being associated with two of the plurality of taps,
wherein, for each unit pixel, the associated two taps arranged diagonally within that unit pixel,
wherein each of the plurality of taps includes:
a controller configured to generate a hole current for moving signal carriers in response to control signals having different phases; and
a detector configured to include a plurality of detection nodes that are disposed to surround the controller and is physically isolated from each other.

15. The image sensor according to claim 14, wherein:
the plurality of taps is arranged to form a triangular shape in adjacent unit pixels.

16. The image sensor according to claim 14, wherein:
among the plurality of taps, each of the taps disposed at upper, lower, left and right side surfaces of the pixel array is shared by a pair of contiguous unit pixels,
wherein:
among the plurality of taps, taps disposed in an effective pixel region of the pixel array are shared by four contiguous unit pixels.

17. The image sensor according to claim 14, wherein:
the controller is shared by contiguous unit pixels, and
the detection nodes are respectively disposed in the contiguous unit pixels in a distributed manner.

18. The image sensor according to claim 14, wherein the associated two taps are separated from each other by a longest distance within the each unit pixel and are arranged to overlap with two opposite vertex regions of the each unit pixel, respectively.

19. An image sensor including an array of unit pixels,
wherein each unit pixel includes:
a first tap configured to capture and accumulate signal carriers within a hole current; and
a second tap configured to provide the hole current,
wherein each of the first tap and the second tap includes:
a controller configured to generate the hole current for moving the signal carriers in response to control signals having different phases; and
a detector configured to include a plurality of detection nodes that are disposed to surround the controller and is physically isolated from each other,
wherein the first and second taps are separated from each other by a longest distance within the unit pixel, wherein the controller is formed in a round shape within the unit pixel, and wherein each of the plurality of detection nodes extends in a direction perpendicular to a diagonal extending between the first and second taps.

20. The image sensor including the array of unit pixels according to claim 19, wherein the first tap and the second tap are arranged to overlap with a two opposite vertex regions of the unit pixel, respectively.

* * * * *